United States Patent [19]
Chiu

[11] Patent Number: 5,532,614
[45] Date of Patent: Jul. 2, 1996

[54] WAFER BURN-IN AND TEST SYSTEM

[75] Inventor: Anthony M. Chiu, Richardson, Tex.

[73] Assignee: Texas Instruments Incorporated, Dallas, Tex.

[21] Appl. No.: 431,204

[22] Filed: Apr. 28, 1995

Related U.S. Application Data

[62] Division of Ser. No. 191,847, Feb. 4, 1994, Pat. No. 5,444,366, which is a division of Ser. No. 954,592, Sep. 30, 1992, Pat. No. 5,307,010, which is a continuation of Ser. No. 640,198, Jan. 11, 1991, abandoned.

[51] Int. Cl.$^6$ ............................ G01R 31/28; H01L 21/66
[52] U.S. Cl. .................... 324/763; 257/48; 324/158.1; 324/765; 437/8
[58] Field of Search ............................ 324/158.1, 765, 324/537, 763, 760; 257/48; 29/593; 437/8, 51

[56] References Cited

U.S. PATENT DOCUMENTS

| | | | |
|---|---|---|---|
| 3,702,025 | 11/1972 | Archer | 437/51 |
| 3,803,483 | 4/1974 | McMahon, Jr. | 324/158.1 |
| 3,835,530 | 9/1974 | Kilby | 437/8 |
| 3,849,872 | 11/1974 | Hubacher | 437/8 |
| 4,281,449 | 8/1981 | Ports et al. | 29/593 |
| 4,356,379 | 10/1982 | Graeme | 219/209 |
| 4,426,773 | 1/1984 | Hargis | 324/158.1 |
| 4,467,400 | 8/1984 | Stopper | 361/403 |
| 4,611,385 | 9/1986 | Forrest et al. | 29/574 |
| 4,628,590 | 12/1986 | Udo et al. | 29/575 |
| 4,755,750 | 7/1988 | Leuschner | 324/758 |
| 4,801,869 | 1/1989 | Sprogis | 324/765 |
| 4,937,203 | 6/1990 | Eichelberger et al. | 437/8 |
| 4,956,602 | 9/1990 | Parrish | 324/537 |
| 4,961,053 | 10/1990 | Krug | 324/537 |
| 5,037,771 | 8/1991 | Lipp | 437/51 |
| 5,059,899 | 10/1991 | Farnworth et al. | 324/765 |
| 5,241,266 | 8/1993 | Ahmad et al. | 371/22.5 |
| 5,294,776 | 3/1994 | Furuyama | 324/158.1 |

FOREIGN PATENT DOCUMENTS

| | | |
|---|---|---|
| 0405586A1 | 1/1991 | European Pat. Off. . |
| 0413451A2 | 2/1991 | European Pat. Off. . |
| 82/02603 | 8/1982 | WIPO . |
| 88/02549 | 4/1988 | WIPO . |

OTHER PUBLICATIONS

"Wafer Burn–In Isolation Circuit", *IBM Technical Disclosure Bulletin*, vol. 32, No. 6B, Nov. 1989, New York, pp. 442–443.

*Primary Examiner*—Ernest F. Karlsen
*Attorney, Agent, or Firm*—W. James Brady, III; Richard L. Donaldson

[57] ABSTRACT

An interconnection system and method of testing and performing burn-in of semiconductor devices prior to separation from the semiconductor wafer on which the devices are formed includes forming interconnection layers of contacts and conductors over the devices and then testing and performing burn-in on the devices. Faulty devices are disconnected from the conductors prior to performing additional test and burn-in. The interconnections are removed prior to separating the device on the wafer, and prior to further possible tests and packaging.

5 Claims, 3 Drawing Sheets

WAFER BURN-IN AND TEST SYSTEM

This is a division of application Ser. No. 08/191,847, filed Feb. 4, 1994, now U.S. Pat. No. 5,444,366, which is a division of Ser. No. 07/954,592, filed Sep. 30, 1992, now U.S. Pat. No. 5,307,010, which is a continuation of Ser. No. 07/640,198, filed Jan. 11, 1991, now abandoned.

FIELD OF THE INVENTION

This invention relates to the testing and burn-in of semiconductor devices, and more particularly to a system and method of testing and burn-in whole wafers prior to dicing the wafer.

BACKGROUND OF THE INVENTION

Most MOS semiconductor products require burn-in and testing to avoid field failures due to devices which are faulty when manufactured. Some procedures use stress by probing at elevated voltages to detect and sort faulty chips before packaging and burn-in.

High pin count contact assemblies similar to the ones used in conventional wafer probe systems are not practical due to the difficulty in maintaining good contact with all the bond pads, between 3000 and 6000, during the burn-in period. This period can range from 20 hours to 120 hours. The construction of such high pin count burn-in probes is expensive, if not impossible.

A flexible, reusable contact assembly, fabricated using plating techniques is less expensive than individual pin probes, but this type of contact cannot be used with bare aluminum bond pads due to the natural oxide on aluminum bond pads. A bumping or oxide removal step is generally required of the bond pad before this type contact assembly can be used. This application, however, is very sensitive to contact pressure and deemed impractical.

BRIEF SUMMARY OF THE INVENTION

In the present invention, a positive contact is made to every bond pad on each semiconductor on a wafer. Either a multilayer or single layer structure may be used.

In the multilayer structure, contacts are formed around the edge of the wafer. A first layer of a plurality of conductors is formed on an insulating layer over the face of the wafer. There is one conductor for each bond pad on each device that is to be tested. A second layer of a metal conductors is formed over the first layer of conductors. The second layer of leads interconnect common bond pads (for example, pin 1 of each device) together, and to a contact on the edge of the wafer. In this way the semiconductor devices on a single column of devices on the wafer are effectively connected in parallel. This burn-in method is extremely useful for memory devices where all the address lines and input lines can be activated simultaneously. The first layer of conductors may be connected to the second layer of conductor through fuse links. These links may later be cut by using a laser to "disconnect" inoperable or shorted devices.

The single layer structure uses a single conductor to connect the common bond pads of the devices in a row of devices. Each bond pad may be connected to the conductor by a fuse link.

While the devices are still on the wafer, they may be connected to burn-in voltages. After burn-in, the burn-in metal interconnect structure is removed. Tests may be made to identify faulty devices, and faulty devices marked for scrap. The devices are then separated for packaging and final test.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
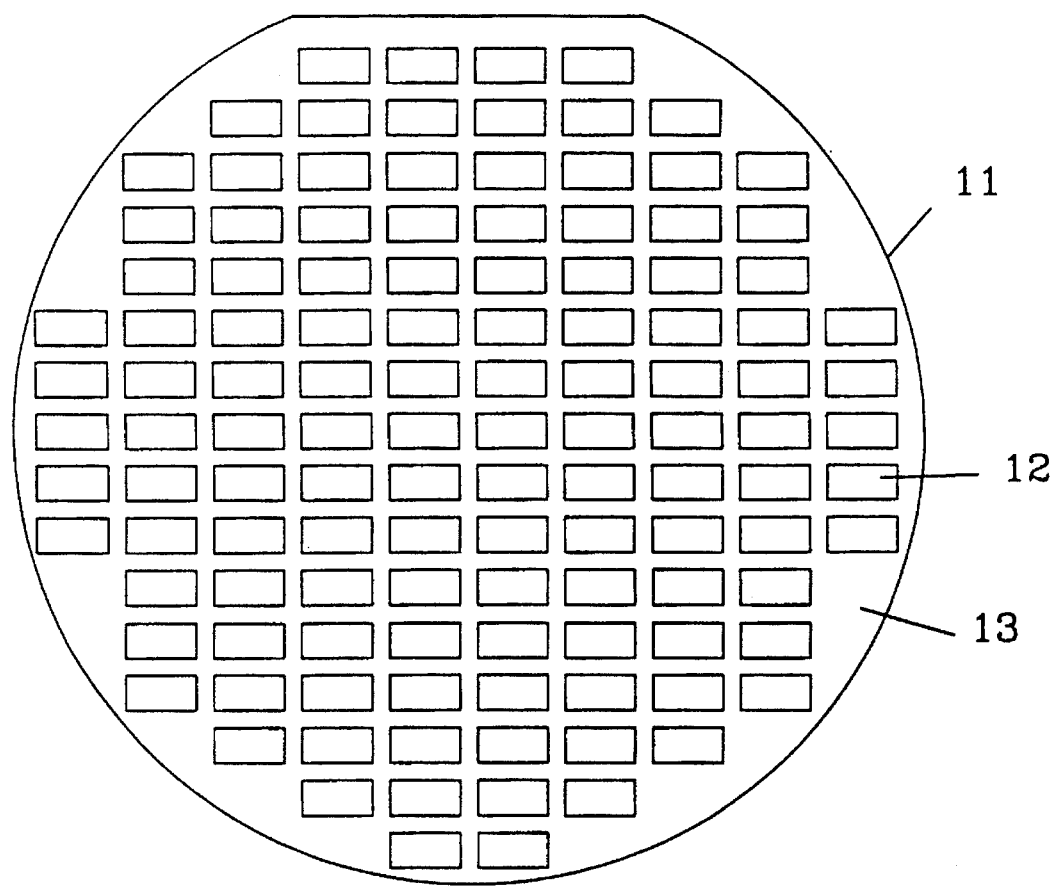
FIG. 1 illustrates a semiconductor wafer with a plurality of devices formed thereon.

FIG. 1 illustrates a semiconductor wafer 11 with a plurality of semiconductor devices 12 formed thereon. Wafer 11 has a marginal area 13 around the edge of the wafer that is clear of devices. Test points are formed on the marginal area 13 to provide contact access to the semiconductor devices for testing and burn-in, as herein after described.

Figure 2:
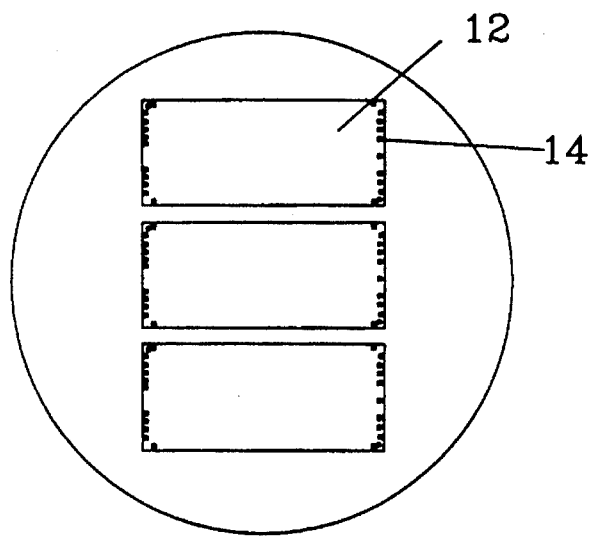
FIG. 2 shows an enlarged view of three devices on the wafer.

FIG. 2 is an enlarged view of a portion of wafer 11 showing three semiconductor devices 12 having bond pads 14 thereon. Bond pads 14 are the contact for the device 12.

Figure 3:
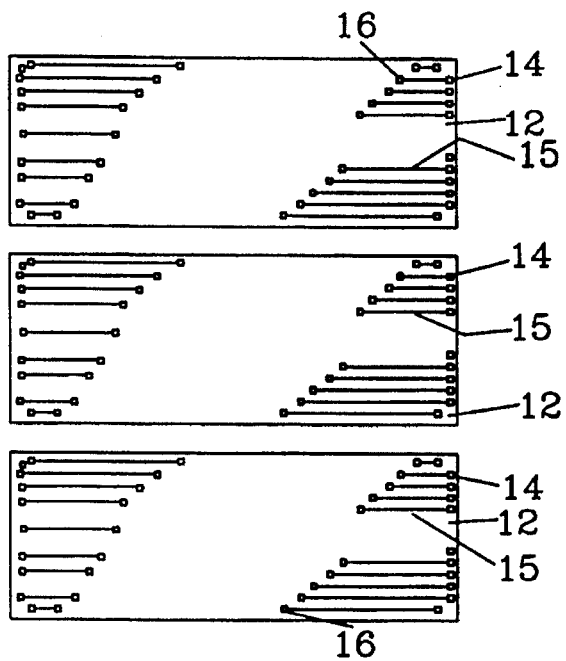
FIG. 3 shows three devices with a first layer of conductors thereon.

FIG. 3 illustrates the first step in providing a connection interface for each of the semiconductor devices 12. A first layer of interconnections are formed on the surface of the wafer, over each individual semiconductor device. The procedure is as follows. An adhesive, such as thermal plastic, is applied over the wafer, and then a dielectric material, such as polyimide, is applied over the adhesive. The dielectric is then patterned to provide an opening over each bond pad 14. A layer of a first metal such as TiW is applied over the dielectric and then a second metal is applied, such as copper. The metal layer is then patterned and etched to form the fuse link conductors 15, exposed conductors that can be cut open later to isolate the shorted devices. Each conductor 15 is connected at one end to a device bond pad 14. On the other end of each conductor 15, opposite the end connected to the device bond pad, is formed via pad 16.

Figure 4:
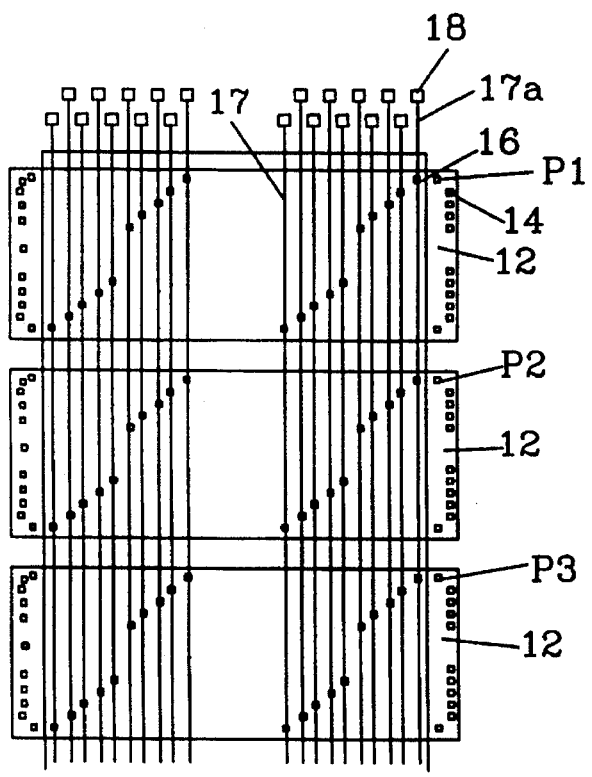
FIG. 4 shows the three devices of FIG. 3 with a second layer of conductors thereon.

FIG. 4 illustrates the second step in providing a connection interface for each semiconductor device on wafer 11. Continuing the process, a dielectric is applied over the wafer, covering conductors 15 and via pads 16. Via patterns are etched on the polyimide. A second layer of metal is applied over the dielectric, for example a layer of TiW followed by a layer of copper. The second layer of metal is patterned and etched to form interconnection conductors 17. The polyimide is also etched during this masking step to expose part of conductors 15 (not illustrated). Each of these conductors connects the via pads on each device in a particular column. For example, a conductor connecting to a via pad is connected by conductor 15 to a respective bond pad on each device. For example, conductor 17a is connected to bond pads $P_1$, $P_2$ and $P_3$ by a respective conductor 15 and via pad 16. Each conductor 17 is connected to a test point 18 located in the non-patterned area 13 of wafer 11.

A preliminary test of the devices on the wafer may have located inoperable devices. The inoperable device is electrically isolated by cutting connector 15 of a device by, for example, a laser beam. After preliminary test, for opens and shorts, the remaining devices are subjected to a burn-in to determine if there are additional defective devices. After burn-in and preliminary test, the two layers of conductors 15 and 17 are removed, and the wafer divided into individual devices for further assembly.

Figure 5:
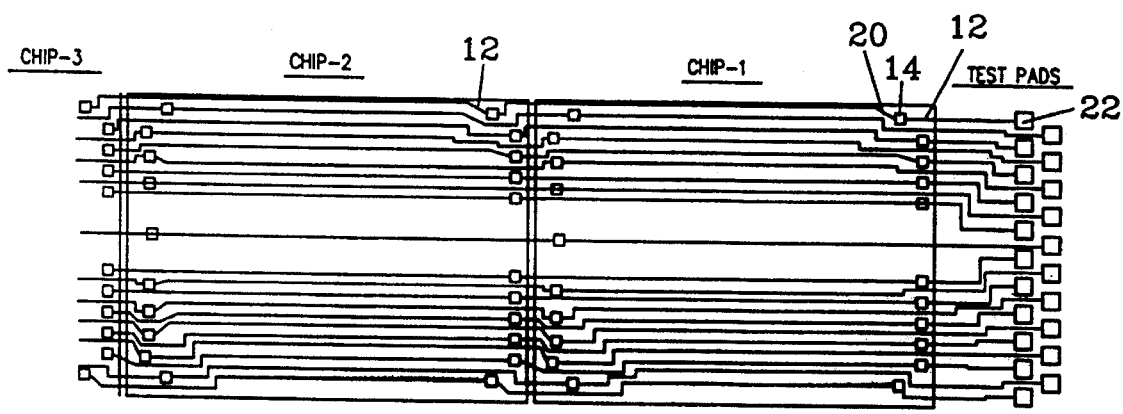
FIG. 5 illustrates a single layer of interconnections.
Figure 6:
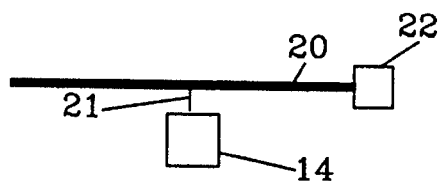
FIG. 6 illustrates a fuse link connection from a conductor to a bond pad on the semiconductor device.

FIG. 5 illustrates a second embodiment of the invention where a single layer of interconnections is used. A layer of insulating material is applied over the wafer and each device thereon. A plurality of interconnections 20 are formed thereon with each interconnection 20 being connected to the same respective bond pad 14 on each device in row of devices. This interconnect system is practical if there are no shorts on any of the devices on the wafer. If there are shorts, and it is required to isolate the shorted devices, then a fuse link structure is needed. Between the interconnection 20, and the bond pad 14 on the device, is a fuse link 21 (FIG. 6). Each interconnection has a test pad contact 22 located around the edge 13 of wafer 11 (FIG. 1).

The test and burn-in procedure for the embodiment of FIG. 5 is the same as the procedure for the embodiment in FIGS. 4 and 5. Preliminary test is made for defective devices. Defective devices are electrically isolated by opening fuse link 21. Burn-in and test procedures are then processed, after which the wafer is divided into the individual devices for further assembly.

One advantage of the interconnection system of the invention is that preliminary test may be made in parallel prior to dividing the wafer into the individual devices, and that the interconnection may then be removed for final individual device assembly and test. To test devices in wafer form, it is necessary to contact the "output" pin(s) of each device. This is accomplished by the use of a probe card or an additional metal layer that connects the output pins to a more convenient location on the wafer.

What is claimed:

1. A method of forming an interconnection system to semiconductor devices formed on a wafer for burn-in and testing of the semiconductor devices prior to separation from the semiconductor wafer, comprising the steps of:

forming an insulating layer over the semiconductor wafer and the semiconductor devices formed thereon, the semiconductor devices arranged in rows, each semiconductor device having a plurality of bond pads and first and second edges extending in a row direction, and the insulating layer having openings over each of the bond pads;

forming a plurality of conductors, each of said conductors overlaying the semiconductor devices in a row without extending over the first and second edges of the semiconductor devices in the row, each of said conductors connected to a bond pad of each semiconductor device in the row;

forming test point contacts on the semiconductor wafer at locations not containing semiconductor devices; and connecting each of the test point contacts to one of the plurality of conductors.

2. The method according to claim 1, including the step of applying a layer of adhesive material prior to forming the insulating layer.

3. The method of claim 1 further comprising the step of forming fuse links of a low power carrying conductor which open when an overload occurs during burn-in, each of said fuse links connecting one of the bond pads to one of the conductors.

4. A method of forming an interconnection system to semiconductor devices formed on a wafer for burn-in and testing of the semiconductor devices prior to separation from a semiconductor wafer, comprising the steps of:

forming a first insulating layer over the semiconductor wafer and the semiconductor devices formed thereon, each semiconductor device having a plurality of bond pads and edges defining a top surface, the first insulating layer having openings over each of the bond pads;

forming a layer of first conductors over said first insulating layer, each of said first conductors overlaying an associated semiconductor device without extending past the edges defining a top surface of said associated semiconductor device, each of said first conductors connected to a bond pad on said associated semiconductor device;

forming a second insulating layer over the layer of first conductors, the second insulating layer having via openings to each of the first conductors;

forming a layer of second conductors on the second insulating layer, each of said first conductors connected through a via opening to one of said second conductors; and forming test point contacts on the semiconductor wafer, each test point contact connected to one of said second conductors.

5. The method of claim 4 further comprising the step of forming fuse links of a low power carrying conductor which open when an overload occurs during burn-in, each of said fuse links connecting one of the bond pads to one of the first conductors.

* * * * *